United States Patent [19]

Ogawa

[11] Patent Number: 4,926,567

[45] Date of Patent: May 22, 1990

[54] PROCESS AND APPARATUS FOR DRYING COATED WEB

[75] Inventor: Masaharu Ogawa, Shizuoka, Japan

[73] Assignee: Fuji Photo Film Co., Ltd., Minami-ashigara, Japan

[21] Appl. No.: 881,271

[22] Filed: Jul. 2, 1986

[30] Foreign Application Priority Data

Jul. 4, 1985 [JP] Japan ............................. 60-145706
Jul. 4, 1985 [JP] Japan ............................. 60-145707

[51] Int. Cl.$^5$ ............................................. F26B 3/04
[52] U.S. Cl. ........................................... 34/23; 34/27; 34/36; 34/74; 34/79
[58] Field of Search ............. 34/27, 32, 72, 73, 74, 34/78, 36, 37, 79, 23; 432/72

[56] References Cited

U.S. PATENT DOCUMENTS

| | | | |
|---|---|---|---|
| 2,743,529 | 5/1956 | Hayes | 34/72 |
| 3,875,678 | 4/1975 | Vits | 34/72 |
| 3,909,953 | 10/1975 | Hemsath et al. | 34/27 |
| 3,991,481 | 11/1976 | Coraor et al. | 34/72 |
| 4,150,494 | 4/1979 | Rothchild | 34/36 |
| 4,164,819 | 8/1979 | Devillar | 34/72 |
| 4,185,397 | 1/1980 | Hutzenlaub | 34/36 |
| 4,341,167 | 7/1982 | St. John | 34/72 |
| 4,343,769 | 8/1982 | Henkelmann | 34/72 |
| 4,475,294 | 10/1984 | Henricks | 34/72 |
| 4,484,396 | 11/1984 | Darm | 34/74 |

*Primary Examiner*—Henry A. Bennet
*Attorney, Agent, or Firm*—Burns, Doane, Swecker & Mathis

[57] ABSTRACT

A process and apparatus for drying a web coated with a coating composition containing an inflammable organic solvent which comprises, drying the coated web by passing through a closed-type oven where a hot inert gas is filled, recovering the organic solvent from the exhaust gas of the above oven by condensation, heating the exhaust gas of the condenser by incinerating the organic solvent remaining therein and/or a waste solvent discharged from the coating apparatus, and returning the heated exhaust gas to the oven, and apparatus for the same.

7 Claims, 2 Drawing Sheets

PROCESS AND APPARATUS FOR DRYING COATED WEB

BACKGROUND OF THE INVENTION

1. Field of the invention

This invention relates to a process and an apparatus for drying a coated web such as photosensitive materials for photographic purpose (photographic photosensitive materials).

2. Description of prior art

Various photographic, photosensitive materials and other materials are manufactured by drying a continuous web such as a plastic support or a paper support on which one or more coating compositions are applied. This composition is generally produced by dissolving or dispersing prescribed components in an organic solvent. The coated web is dried by blowing hot air or irradiation by infrared light. In such drying methods, when the concentration of the organic solvent vapor becomes high, an explosion occurs. Therefore, a large quantity of air was introduced into the oven, and thereby the concentration of the organic solvent vapor was controlled so as to be kept lower than one third of the explosion limit. As a result, a lot of thermal energy was consumed for heating of the air for dilution and for incineration of a large amount of the exhaust gas, and evaporation of the solvent. Various investigations for solving this problem have been made, and for example, recovery of heat of the exhaust gas by using a heat exchanger and a method of using water as the solvent have been proposed.

On the other hand, it is known that, in the drying process of continuous coating on a metallic strip, an explosion of a solvent is prevented by blowing a hot inert gas into an oven and thereby the air for dilution is not added (USP No. 3,909,953). In this method, the exhaust gas is mixed with air, and organic solvent in the gas is incinerated to produce an inert gas. Heat of the inert gas is utilized for the drying of the metallic strip by returning the incinerated gas into the oven, and excess heat is recovered by a heat exchanger and utilized.

In the recovery of heat of the exhaust gas by using a heat exchanger, yield of heat recovery is usually about 50 to 60%, and cost of equipment is expensive because a big heat exchanger is necessary. In the method of using water as the solvent, consumption of thermal energy is increased by evaporating the water to the contrary. In the foregoing method to incinerate the exhaust gas, cost of equipment is expensive because a big incinerator and heat exchanger are necessary, and it is also a problem that whole amount of the organic solvent which is valuable is incinerated.

SUMMARY OF THE INVENTION

Accordingly, an object of the invention is to provide a drying system for a web coated with a coating composition containing an inflammable organic solvent wherein air for dilution is excluded, and thereby, apparatus is made compact and thermal energy is saved.

Another object of the invention is to provide a drying system for a web coated with a coating composition containing an inflammable organic solvent which does not increase thermal energy for drying.

Still another object of the invention is to provide a drying system for a web coated with a coating composition containing an inflammable organic solvent wherein the total system is constructed rationally and efficiently, and thereby the drying cost is made lower.

In order to achieve these objects, the inventors have tried various means, and they have completed a drying system comprising recovering the inflammable organic solvent from the exhaust gas of the oven by condensation, heating the exhaust gas of the condenser by utilizing combustion heat of the organic solvent remaining therein and/or a waste solvent discharged from the coating apparatus, returning the heated exhaust gas to the oven and thereby the drying is carried out under an inert atmosphere. They have found that, by using this system, the blower volume can be lowered, the incinerator and heat exchanger can be made smaller and thereby the whole drying apparatus can be made compact. Furthermore, the solvent recovered can be reused.

DETAILED DESCRIPTION OF THE INVENTION

Figure 1:
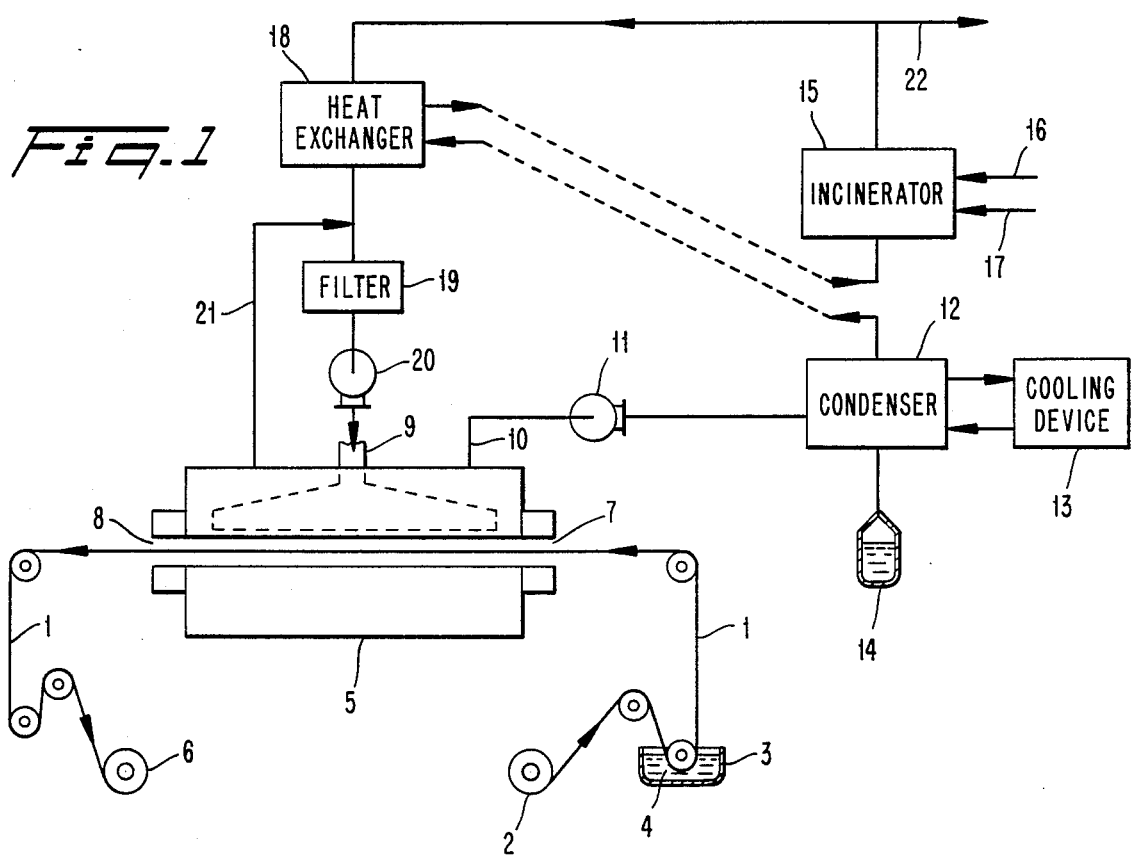
FIG. 1 is a flow chart indicating a fundamental system of the invention in the case that the remaining solvent in the exhaust ga of a condenser is incinerated.

The inflammable organic solvent includes benzene, toluene, an alcohol such as methanol, a ketone such as acetone and methyl ethyl ketone, methyl acetate and methylene glycol.

Coating apparatus may be usual for each kind of web material.

The drying oven should be closed-type in order to keep its inside filled with an inert gas. The inert gas prevents combustion, and includes nitrogen gas and carbon dioxide gas. An entrance and an exit for the passage of the coated web should be provided to the drying oven. Both openings are usually slit-shape. An inlet port and an exhaust port of the inert gas are also necessary. Besides, straightening vanes, baffle plates, etc. may be provided. An auxiliary heater such as infrared heater may also be attached to the oven.

A condenser is connected to the exhaust port of the drying oven. The condenser condenses the organic solvent evaporated from the coated web and contained in the exhaust gas of the drying oven, and an usual condenser may be employed. A cooling apparatus to cool a refrigerant for the condenser is necessary.

The recovered organic solvent is preferably recycled as the solvent of the coating composition and accordingly, its receiving tank is connected to the preparation apparatus of the coating composition such as its preparation tank.

The exhaust gas of the condenser is heated and returned to the oven by connecting to its inlet port. The system of the invention is also characterized by the above heating source. That is, as the heating source, one or both of the organic solvents remaining in the exhaust gas and a waste solvent discharged from the coating apparatus for the web are utilized. The largest component of the waste solvent is the solvent for the coating composition, although it contains small amount of the coating composition, etc.

An incinerator for the incineration of the above heating source is also necessary.

When the organic solvent remaining in the exhaust gas of the condenser is utilized as the heating source, an auxiliary fuel may be employed in order to secure the drying of the coated web. As the auxiliary fuel, the above waste solvent is preferably employed. However, other fuels such as methane, propane, butane, LNG, LPG, kerosene, heavy oil, etc. may also be utilized instead of or in addition to the waste solvent. In the case that the drying oven must be maintained in extremely clean conditions, clean fuels such as methane, propane, butane, LNG, LPG, etc. are employed, and in other cases, inexpensive fuels are preferably employed. The auxiliary fuel may be added to the exhaust gas of the condenser or may directly be blown into the incinerator. When the organic solvent is not expensive, the auxiliary fuel may not be added by increasing the remaining ratio of the organic solvent. In this case, the remaining amount is set so that the quantity of its combustion heat is slightly larger than the total quantities of the heat necessary to dry of the coated web and the heat loss of the system. On the other hand, when the organic solvent is expensive, it is preferable to recover as much as possible. The incinerator is connected to the condenser and the inlet port of the drying oven to form a circuit of the inert gas. Since the exhaust gas of the incinerator consists of nitrogen gas, carbon dioxide gas, etc., this exhaust gas is used as the inert gas for the drying oven. Between the incinerator and the drying oven, a heat exchanger is provided in order to lower the temperature of the exhaust gas of the incinerator. A dust filter, a blower, etc. may also be provided therebetween. It is preferable that the exhaust line of the condenser is connected to the incinerator through this heat exchanger, and the exhaust gas of the condenser is preliminarily heated. Thereby, heat of the incineration is further utilized. On the other hand, when a feedback line is provided from the drying oven to the line between the incinerator and the drying oven, temperature of the exhaust gas of the incinerator may also be lowered by the dilution with the inert gas of the oven.

When the waste solvent is utilized as the heating source, in the case that the exhaust gas is not suitable for the inert gas to be recycled, only its combustion heat is utilized by using a heat exchanger.

An air inlet for combustion is provided to the incinerator. If cheap oxygen gas can be obtained, it may also be used for the combustion.

In the system of the invention, the drying oven is filled with an inert gas. Therefore, the explosion of the organic solvent vapor is prevented and its high concentration in the oven is allowed. Because of this high concentration, the organic solvent can be efficiently recovered from the exhaust gas of the oven. The condenser for recovering the organic solvent is provided at the position of the lowest temperature in the circuit of the system to decrease thermal energy loss. Since thermal energy for drying the coated web is obtained by utilizing the remaining organic solvent and/or a waste solvent of its coating apparatus, the system works further efficiently. In the case that the exhaust gas of the condenser is incinerated the, inert gas pressure of the circuit is raised by the introduction of air for combustion, and inflow of air into the drying oven is thereby prevented. When the exhaust gas of the condenser is heated by the heat exchanger between the incinerator and the drying oven prior to the incineration, thermal energy is utilized further efficiently. The organic solvent can be utilized repeatedly. A part of the organic solvent is always consumed by incineration of that remaining in the exhaust gas and/or waste solvent, and is replaced by fresh solvent. Accordingly, the purity of the organic solvent in the system can be maintained in a suitable range.

According to the system of the invention, supply a of air for dilution to the drying oven is not necessary, and therefore, thermal energy for heating this air is also not necessary. Since the circulating amount of the inert gas is small, the apparatus in the circuit can be made compact. Since the incineration amount of the organic solvent is reduced, incinerator and heat exchanger can be constructed of the small size. As a result of these, the cost of the apparatus can be lowered, and the setting space of the apparatus can be small. Since the organic solvent is recycled, its consumption can be lowered.

EXAMPLES

Example 1

A fundamental system of the invention is illustrated in FIG. 1.

As shown in the drawing, a web 1 is unwound from its roll 2, and applied with a coating composition 4 by a well known coating apparatus 3. The coated web 1 is dried during passing through a drying oven 5, and wound to a roll 6.

The drying oven 5 is closed-type and long box-shape. An entrance 7 and an exit 8 for the passage of the coated web 1 are opened both ends of it longitudinal direction. Both openings 7, 8 are slit-shape. An inlet port 9 and an exhaust port 10 of an inert gas are provided at the upper face of the oven 5. The exhaust port 10 is connected to a condenser 12 through an exhaust fan 11. Number 13 indicates a cooling device supplying a refrigerant to the condener 12, and 14 indicates a receiver of the condensed solvent. The condenser 12 is further connected to an incinerator 15 through a heat exchanger 18. Most organic solvent contained in the exhaust gas of the oven 5 is recovered at the condenser 12, and preliminarily heated by the exhaust gas of the incinerator 15 at the heat exchanger 18. Then, the gas is incinerated at the incinerator 15. An air supply pipe 16 for combustion and an auxiliary fuel supply pipe 17 are joined to the incinerator 15. The outlet of the incinerator 15 is joined to the heat exchanger 18, and the heat exchanger 18 is further joined to the inlet port 9 of the drying oven 5 through a dust filter 19 and a blower 20. A feedback pipe 21 is provided from the drying oven 5 to the pipe between the heat exchanger 18 and the dust filter 19. By using this feedback line, the inert gas in the oven 5 is circulated and temperature of the exhaust gas of the incinerator 15 can be lowered by the dilution. A gas discharging pipe 22 is joined to the pipe between the incinerator 15 and the heat exchanger 18, and pressure of the circuit is controlled by using this line.

A photosensitive diazo compound, a photopolymerizable composition and other compounds were dissolved in acetone to produce a coating composition A polyethylene terephthalate film was employed as support, and the above coating composition 4 was applied on it to form a coated web 1. This coated web 1 was dried using the apparatus of FIG. 1. Temperature of the oven 5 was set at 90° C., and 90% of the acetone contained in the exhaust gas was recovered by the condenser 12. Natural gas was used as the auxiliary fuel, and the exhaust gas of the condenser 12 was completely incinerated in the incinerator 15. Supply of the natural gas was adjusted so that temperature of the inert gas at the inlet port 9 was 110° C. The coated web was dried sufficiently to produce a photographic photosensitive material, and the drying was continued without any trouble.

Example 2

Figure 2:
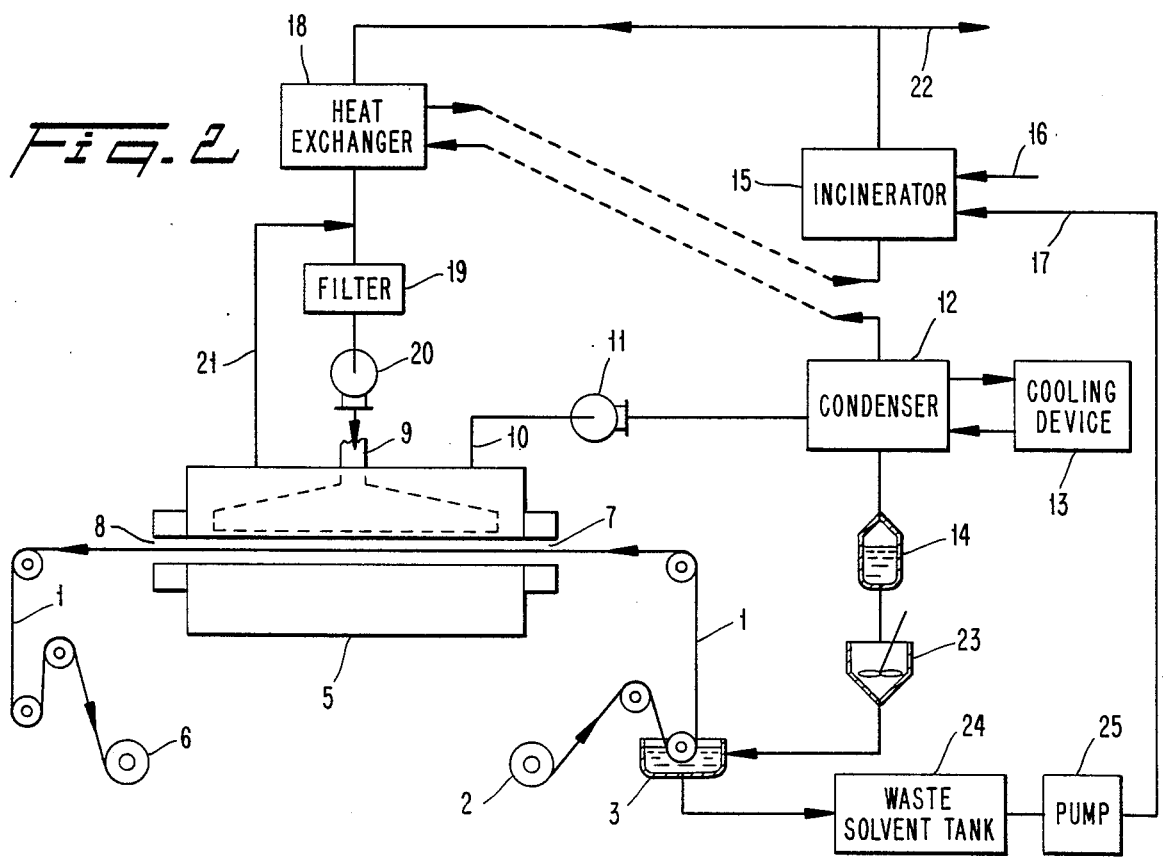
FIG. 2 is a flow chart indicating a modified system of FIG. 1 in which a recycle line of the recovered solvent and a supply line of waste solvent to the incinerator are added.

A modified system of Example 1 is illustrated in FIG. 2.

In this system, a pipe is provided from the receiver 14 to a preparation tank 23 of the coating solution so that the recovered organic solvent can be recycled. Another pipe is also provided from the coating apparatus 3 to the auxiliary fuel supply pipe 17 through a waste solvent receiving tank 24 and a pump 25 so that the waste solvent can be utilized as the auxiliary fuel.

Example 3

Figure 3:
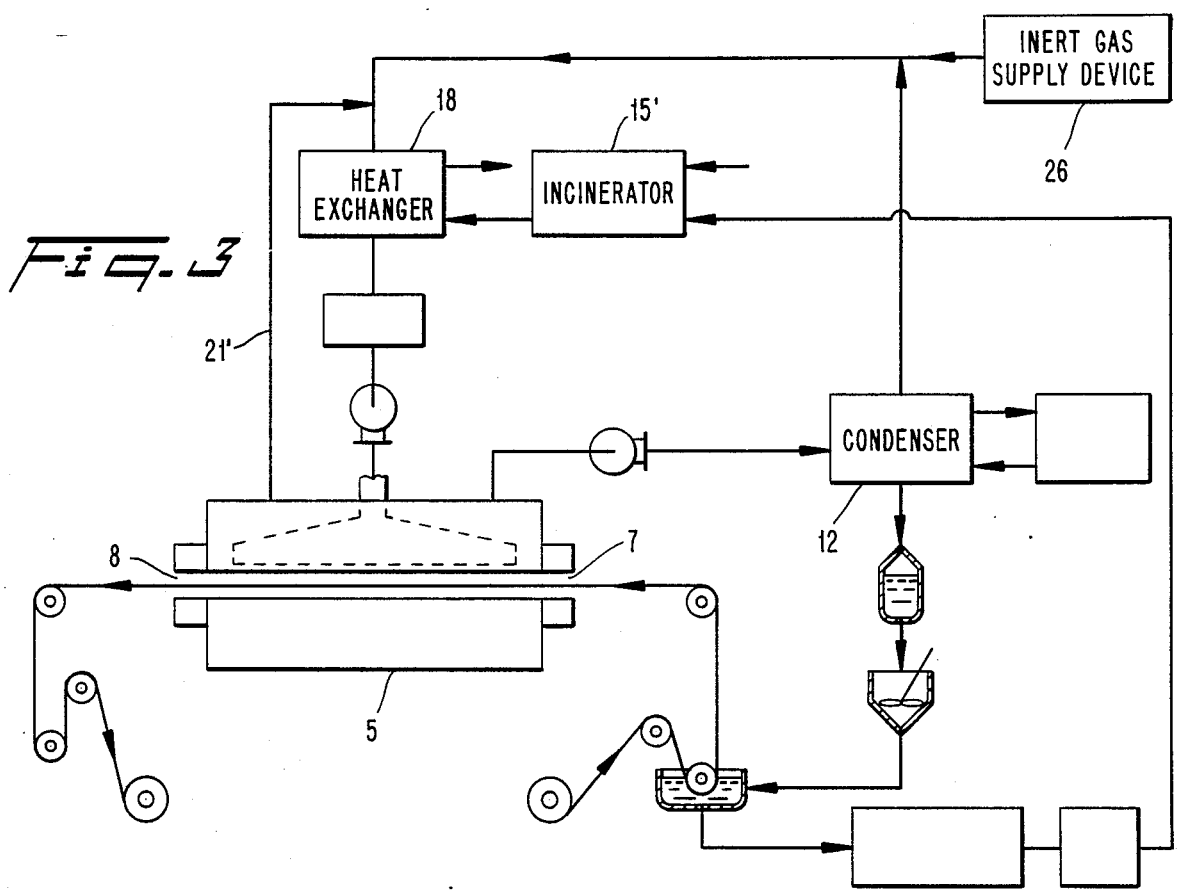
FIG. 3 is a flow chart indicating another system of the invention in the case where the exhaust gas of the condenser returns without incineration and is heated by combustion heat of a waste solvent discharged from the coating apparatus.

Another system of the invention is illustrated in FIG. 3.

In this system, the pipe line is provided so that the inert gas discharged from the condenser 12 is directly sent to the heat exchanger 18 without passing through the incinerator 15'. Combustion heat of the incinerator 15' is recovered through the heat exchanger 18, and the exhaust gas of the incinerator 15' is not recycled. As a result, the inert gas is insufficient and is auxiliary supplied from an inert gas supply device 26. The exhaust gas of the condenser 12 is recycled to the drying oven 5 without incineration. The other terminal of the feedback pipe 21' is joined to the inlet of the heat exchanger 18, and the inert gas in the oven 5 can be heated by the heat exchanger 18. This system is utilized in the case when the exhaust gas of the incinerator adversely influences the coated web.

Example 4

Figure 4:
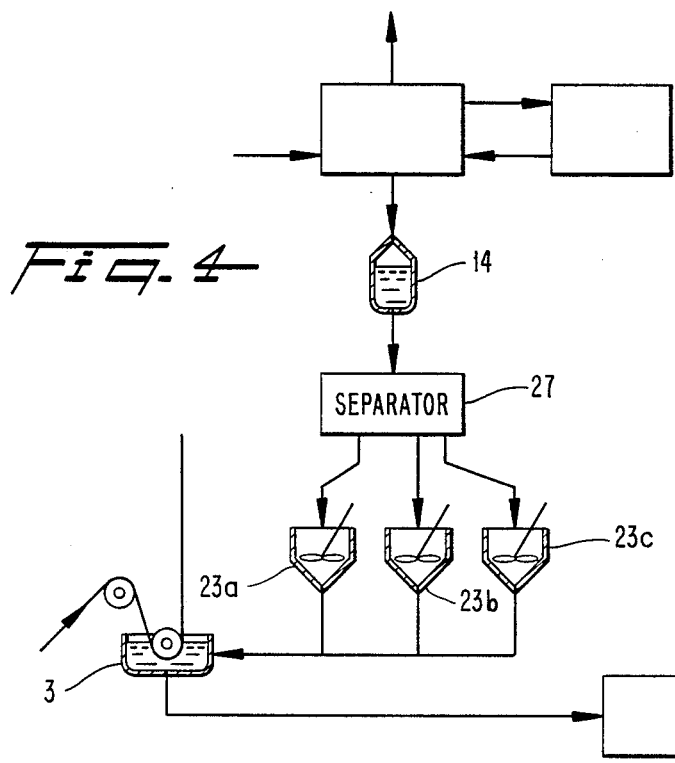
FIG. 4 is a partial flow chart indicating a modification of the preparation tank of the coating composition.

The system of this example illustrated in FIG. 4 is a modification of the foregoing examples. This system is applied to the case when the solvent is a mixture and each component is separable.

The recovered solvent in the receiver 14 is sent to a known separator 27, and each component separated is introduced into each preparation tank 23a, 23b, 23c.

I claim:

1. A process for drying a web coated with a coating composition containing an inflammable organic solvent which comprises, drying said coated web by passing through a closed-type oven where a hot inert gas is filled, recovering a substantial portion of said organic solvent from the exhaust gas of said oven by condensation, heating the exhaust gas of said condenser by incinerating the organic solvent remaining therein and returning said heated exhaust gas to said oven.

2. The process of claim 1, wherein said organic solvent is a member selected from the group consisting of benzene, toluene, methanol, acetone, methyl ethyl ketone, methyl acetate and methylene glycol.

3. The process of claim 1, wherein said coated web is a photosensitive material for photographic purpose.

4. An apparatus for drying a web coated with a coating composition containing an inflammable organic solvent which comprises, a closed-type drying oven having an entrance and an exit for the passage of said coated web and an inlet port and an exhaust port of an inert gas, a condenser connected to said exhaust port condensing said organic solvent contained in said exhaust gas, and an incinerator connected to said condenser and said inlet port to form a circuit of said inert gas incinerating the organic solvent remaining in the exhaust gas of said condenser.

5. The apparatus of claim 4, wherein a supply pipe of said condensed solvent is provided from its receiver to the preparation tank of said coating composition, and a supply pipe of a waste solvent discharged from a coating apparatus for said web is provided from its receiver to said incinerator through a pump.

6. The process of claim 1, wherein recovery of said organic solvent by condensation is carried out in a condenser cooled by use of a refrigerant.

7. The process of claim 1, wherein there is also incinerated a waste solvent discharge from a coating apparatus for said web.

* * * * *